(12) United States Patent
Baone et al.

(10) Patent No.: US 9,829,880 B2
(45) Date of Patent: Nov. 28, 2017

(54) SYSTEM AND METHOD FOR MODELLING LOAD IN AN ELECTRICAL POWER NETWORK

(71) Applicant: General Electric Company, Schenectady, NY (US)

(72) Inventors: Chaitanya Ashok Baone, Glenville, NY (US); William James Premerlani, Glenville, NY (US); Yan Pan, Niskayuna, NY (US); Jing Dai, Clifton Park, NY (US); Santosh Sambamoorthy Veda, Clifton Park, NY (US); Zhenyu Tan, Charlotte, NC (US)

(73) Assignee: General Electric Company, Niskayuna, NY (US)

(*) Notice: Subject to any disclaimer, the term of this patent is extended or adjusted under 35 U.S.C. 154(b) by 387 days.

(21) Appl. No.: 14/548,699

(22) Filed: Nov. 20, 2014

(65) Prior Publication Data

US 2016/0147215 A1    May 26, 2016

(51) Int. Cl.
G06F 19/00      (2011.01)
G05B 19/406     (2006.01)
G01R 19/25      (2006.01)
H02J 3/00       (2006.01)

(52) U.S. Cl.
CPC ....... *G05B 19/406* (2013.01); *G01R 19/2513* (2013.01); *H02J 3/008* (2013.01); *G05B 2219/32021* (2013.01); *H02J 2003/007* (2013.01); *Y02E 60/728* (2013.01); *Y02E 60/76* (2013.01); *Y04S 10/265* (2013.01); *Y04S 40/22* (2013.01); *Y04S 50/10* (2013.01)

(58) Field of Classification Search
USPC ......................................................... 700/291
See application file for complete search history.

(56) References Cited

U.S. PATENT DOCUMENTS

| 4,868,410 A | * | 9/1989 | Nakamura | ............ H02J 3/1871 |
| | | | | 307/20 |
| 5,745,368 A | * | 4/1998 | Ejebe | ........................ H02J 3/00 |
| | | | | 307/102 |
| 8,392,031 B2 | | 3/2013 | Krok et al. | |

(Continued)

FOREIGN PATENT DOCUMENTS

| CN | 1632783 A | 6/2005 |
| CN | 101192754 A | 6/2008 |

(Continued)

OTHER PUBLICATIONS

Thomas et al., Optimized voltage and reactive power adjustment inpower grids using the least-squares-method, 2011 IEEE, pp. 1-6.*

(Continued)

*Primary Examiner* — Kidest Bahta
(74) *Attorney, Agent, or Firm* — Nitin N. Joshi

(57) ABSTRACT

A method for modelling load in a power grid is provided. The method includes obtaining measurement data from a measurement device in the power grid, identifying one or more voltage adjustment events in the power grid from the measurement data, and generating a load model based on one or more voltage factors computed using the one or more voltage adjustment events.

20 Claims, 2 Drawing Sheets

(56) References Cited

U.S. PATENT DOCUMENTS

| | | | | |
|---|---|---|---|---|
| 8,588,991 B1 * | 11/2013 | Forbes, Jr. | ............. | G05B 19/02 700/286 |
| 2006/0195229 A1 * | 8/2006 | Bell | ............. | H02J 3/00 700/286 |
| 2009/0265042 A1 * | 10/2009 | Mollenkopf | ............. | H02J 3/12 700/298 |
| 2009/0281679 A1 * | 11/2009 | Taft | ............. | G01D 4/004 700/297 |
| 2010/0318238 A1 * | 12/2010 | Bryson | ............. | G06F 1/26 700/298 |
| 2011/0251732 A1 * | 10/2011 | Schweitzer, III | ............. | H02J 3/12 700/297 |
| 2012/0010756 A1 * | 1/2012 | Larsen | ............. | H02J 3/16 700/289 |
| 2013/0184894 A1 * | 7/2013 | Sakuma | ............. | H02J 3/12 700/298 |
| 2013/0320770 A1 * | 12/2013 | Panosyan | ............. | G05F 1/70 307/82 |
| 2014/0265574 A1 | 9/2014 | Tyler et al. | | |
| 2014/0312693 A2 | 10/2014 | Powell et al. | | |
| 2014/0330441 A1 | 11/2014 | De Castro et al. | | |

FOREIGN PATENT DOCUMENTS

| | | |
|---|---|---|
| CN | 100486073 C | 5/2009 |
| CN | 101599644 A | 12/2009 |
| CN | 101819606 A | 9/2010 |
| CN | 101789598 B | 5/2012 |
| CN | 102545218 A | 7/2012 |
| CN | 102868160 A | 1/2013 |
| CN | 102169646 B | 3/2013 |
| CN | 103033716 A | 4/2013 |
| CN | 103049651 A | 4/2013 |
| CN | 103258144 A | 8/2013 |
| CN | 103279638 A | 9/2013 |
| CN | 103337044 A | 10/2013 |
| CN | 103401238 A | 11/2013 |
| CN | 102377180 B | 12/2013 |
| CN | 103472736 A | 12/2013 |
| CN | 103678931 A | 3/2014 |
| JP | 2002034154 A | 1/2002 |
| JP | 4370062 B2 | 11/2009 |
| WO | 2012114114 A3 | 2/2013 |

OTHER PUBLICATIONS

Gol et al., "A Robust PMU Based Three-Phase State Estimator Using Modal Decoupling", IEEE Transactions on Power Systems, vol. 29, No. 5, Sep. 2014, pp. 2292-2299.

European Search Report and Opinion issued in connection with corresponding EP Application No. 15193972.5 on May 3, 2016.

* cited by examiner

SYSTEM AND METHOD FOR MODELLING LOAD IN AN ELECTRICAL POWER NETWORK

BACKGROUND

The invention generally relates to electrical power networks and, more particularly, to a system and method for modelling loads in the electrical power network.

Power generation systems are used to generate electrical power which is further transmitted to distribution systems via transmission systems. The transmission systems transmit electrical power from a remote location to various distribution systems which may be coupled further to one or more utilities. The distribution system receives the electrical power and distributes the electrical power to various loads coupled to the distribution system. The three aforementioned systems are integrated with each other structurally and operationally which creates a complex electrical power network. The complexity and dynamism of the electrical power network requires an automated approach which helps to reduce losses and increase reliability. Therefore, different software based mechanisms have been employed in the electrical power network to facilitate such reductions of losses and increased reliability.

Some of the software based mechanisms include systems to understand load behavior in the electrical power networks, which may include systems for load forecasting and load modelling. Load modelling is a set of equations, which are used to determine a relationship between the voltage at a bus/node in the electrical power network and the load connected at or downstream from that bus. Such relationship is further employed to estimate a voltage stability of the distribution system or the transmission system to feed the loads coupled to the power grid. However, currently available load modelling systems employ the same load modelling parameters for different conditions and are unable to process field data to provide accurate results. Lack of accurate load modelling parameters leads to incorrect computations of the operating margins of the electrical power network, thereby resulting in instabilities and inefficiencies.

Therefore, the inventors have provided an improved system and method for modelling load in an electrical power network.

BRIEF DESCRIPTION

Briefly, in accordance with one embodiment, a method for modelling load in a power grid is provided. The method includes obtaining measurement data from a measurement device in the power grid, identifying one or more voltage adjustment events in the power grid from the measurement data, and generating a load model based on one or more voltage factors computed using the one or more voltage adjustment events.

In another embodiment, a system for generating a load model for a power grid is provided. The system includes a measurement device for obtaining measurement data in the power grid. The system also includes an event filter configured to identify one or more voltage adjustment events in the power grid from the measurement data. The system further includes a load modelling unit configured to generate a load model based on one or more voltage factors computed using the one or more voltage adjustment events.

In yet another embodiment, a computer readable medium, having instructions stored thereon which, when executed, causes a load modelling system having a measurement device, an event filter and a load modelling unit to perform a method, where the method includes obtaining measurement data from the measurement device in the power grid, identifying one or more voltage adjustment events in the power grid from the measurement data, obtaining a first set of load modelling parameters from a load model library, determining a second set of load modelling parameters based on the first set of load modelling parameters and the one or more voltage adjustment events using a recursive least mean square filter, determining one or more voltage factors for the power grid using the second set of load modelling parameters, generating a load model based on the one or more voltage factors for the power grid, and updating the load model library with the second set of load modelling parameters.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean one, some, or all of the listed items. The use of "including," "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. Furthermore, the terms "circuit," "circuitry," "controller," and "processor" may include either a single component or a plurality of components, which are either active and/or passive and are connected or otherwise coupled together to provide the described function.

Embodiments of the present invention include a system and a method for modelling a load in a power grid. The inventive system and method advantageously provide different load modelling parameters for different conditions using the measurement data collected during those or similar conditions. This allows accurate estimation of the nature of the load like voltage dependency and the voltage sensitivity factor. Such accurate estimation of the voltage dependency and voltage sensitivity factor provides a more reliable load model which helps in increasing efficiency and robustness of the power grid. Moreover, for some analytical purposes such as voltage stability analysis and/or contingency analysis, the voltage sensitivity factor may be used as an alternative to individual values of $K_z$, $K_i$, $K_p$ for accurate and faster analysis.

Figure 1:
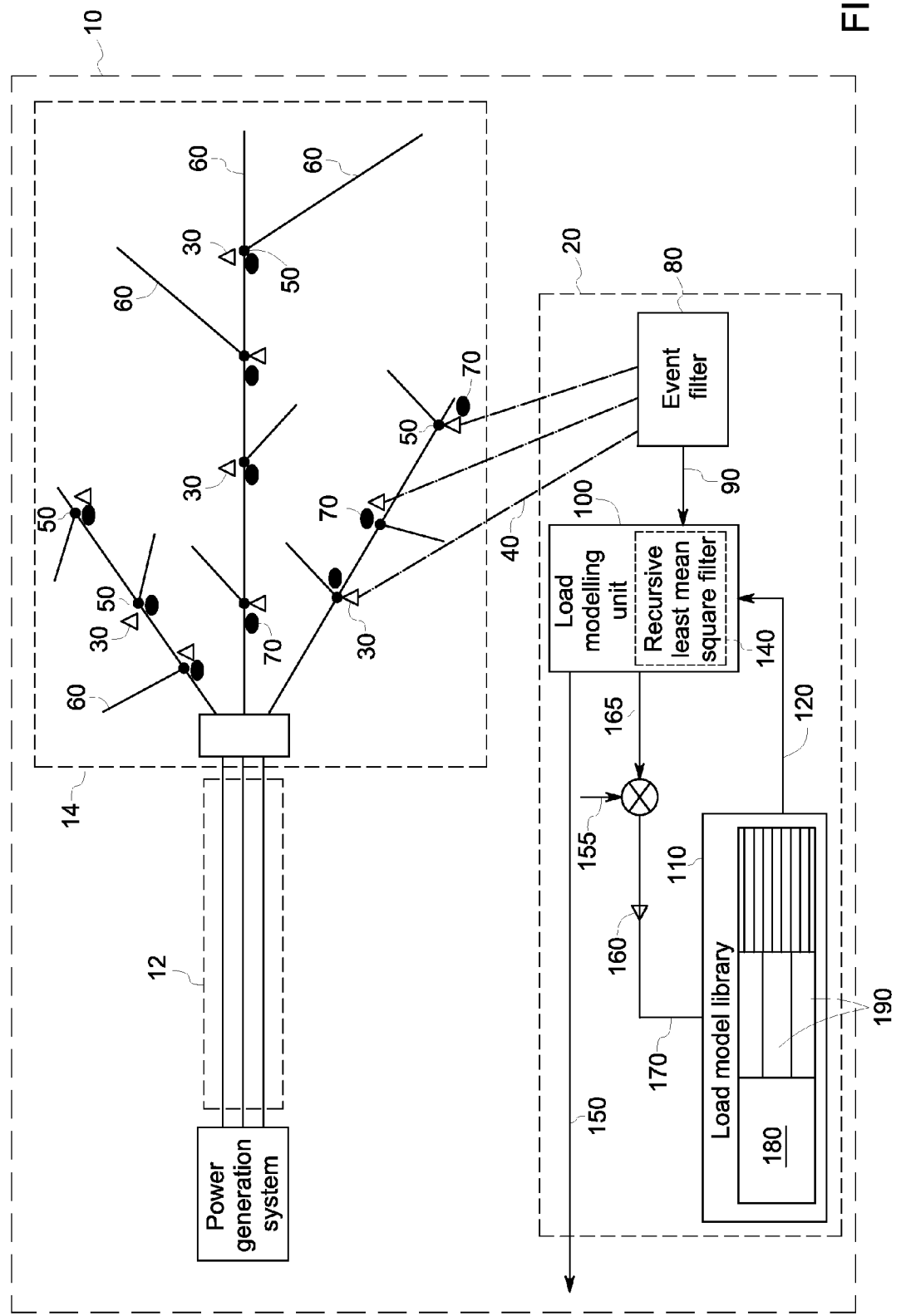
FIG. 1 is a block diagram representation of a system for modelling loads in a power grid in accordance with an embodiment of an invention.

FIG. 1 is a block diagram representation of a power grid 10 including a system 20 for modelling loads in the power grid 10 in accordance with an embodiment of an invention. In this embodiment, the system 20 may include a measurement based load modelling system. In one embodiment, the system 20 may be deployed on a transmission system 12 or a distribution system 14 in the power grid 10 or may reside independently in the power grid 10. In the embodiment, where the system 20 is residing independently in the power grid 10, the system 20 may be operatively coupled to the transmission system, the distribution system or a combination thereof to generate a load model of such one or more systems. The system 20 includes a measurement device 30 configured to obtain measurement data 40 in the power grid 10. In one embodiment, the measurement device 30 may include a supervisory control and data acquisition (SCADA) unit, a remote terminal unit (RTU), a phasor measurement unit (PMU), an advanced metering infrastructure (AMI) meters, a power factor meter, a power quality meter or any other device capable of reading, recording, storing and monitoring power system quantities such as voltage, current, power factor, frequency and the derived quantities like a real power, a reactive power and an apparent power, or a combination of any two or more devices thereof. In another embodiment, the measurement data 40 may include values representative of power, voltage and current at one or more locations 50 in the one or more buses 60 of the power grid 10. One or more measurement devices 30 are situated in the power grid 10 at different locations 50 and are operatively coupled to one or more buses 60 in the power grid 10. The one or more buses 60 are used to transmit or distribute power to various locations 50 and one or more measurement devices 30 may be operatively coupled to each bus 60 at different locations 50 to obtain the measurement data 40 from the one or more buses 60 at respective locations 50. In another embodiment, one measurement device 30 may obtain measurement data 40 from one or more buses 60 in the power grid 10. For the purposes of obtaining measurement data 40, one or more individual loads (not shown) operatively coupled to one or more buses 60 downstream from the location 50 of measurement may be aggregated together based on a predefined criteria to obtain measurement data 40 of the aggregated load 70. In one embodiment, the aggregated load 70 may represent a collective load generated by adding individual loads downstream from the location 50 of measurement. Furthermore, the measurement device 30 obtains the measurement data 40 from the one or more buses 60 and transmits the measurement data 40 to an event filter 80.

The event filter 80 receives the measurement data 40 and identifies one or more voltage adjustment events 90 in the power grid 10 from the measurement data 40. In one embodiment, the event filter 80 filters the measurement data 40 based on a predefined voltage threshold ($V_{th}$). In another embodiment, the one or more voltage adjustment events 90 may include a tap change event in step-up transformers operatively coupled in the power grid 10. The event filter 80 screens the measurement data 40 to determine any change in voltage at a particular location 50 in the power grid 10. To this end, the event filter 80 determines a difference ($\partial V$) between voltages measured by the measurement device 30 at a particular time instant and a previous time instant and uses the difference ($\partial V$) to identify the one or more voltage adjustment events 90. Although different conditions and parameters may be used to identify the one or more voltage adjustment events 90, some of the examples of identifying the one or more voltage adjustment events 90 are stated below:

$(\partial V) > V_{th}$ $(\partial V) > V_{th}$, and $(\partial P * \partial V > 0)$ $(\partial V) > V_{th}$, and $(\partial P * \partial V > 0)$, and $(\partial Q * \partial V > 0)$ where ($\partial P$) is a difference between active power measured at the particular location 50 at a first time instant (T) and a time instant prior to the first time instant (T−n), where n may be 1 to n, ($\partial Q$) is a difference between reactive power measured at the particular location 50 at the first time instant and the time instant prior to the first time instant (T−n), where n may be 1 to n.

The event filter 80 computes ($\partial P$), ($\partial V$), ($\partial Q$), or a combination thereof based on the configuration of the event filter 80 for each of the locations 50 from which the measurement data 40 is received. Furthermore, the event filter 80 identifies the one or more voltage adjustment events 90 at the one or more locations 50 in the power grid 10 and transmits the one or more voltage adjustment events 90 with their respective locations 50 to a load modelling unit 100.

Furthermore, the load modelling unit 100 is operatively coupled to a load model library 110. The load modelling unit 100 receives the one or more voltage adjustment events 90 with their respective locations from the event filter 80 and also receives a first set of load modelling parameters 120 from the load model library 110. The load modelling unit 100 uses the first set of load modelling parameters 120 and the one or more voltage adjustment events 90 to determine a second set of load modelling parameters 130. The load modelling unit 100 uses the second set of load modelling parameters 130 to determine a load model 150. In one embodiment, the load model 150 may include a static load model. To this end, the load modelling unit 100 computes one or more voltage factors (not shown) using the second set of load modelling parameters 130 and the one or more voltage factors are used to generate the load model. In one embodiment, the one or more voltage factors may include a voltage dependency, a voltage sensitivity factor or a combination thereof.

The second set of load modelling parameters 130 is computed using an algebraic equation that is further used to compute the one or more voltage factors. In one embodiment, the algebraic equation may include a quadratic equation, also known as the ZIP load model. In some embodiments, an exponential load model or $$\frac{P}{P_n} = K_z \left(\frac{V}{V_n}\right)^2 + K_i \frac{V}{V_n} + K_p$$

any other algebraic representation of the voltage dependency of load power consumption may be used. The ZIP model can be numerically represented as:
where P represents a bus power corresponding to a power transmission or distribution bus at the particular location from where measurement is obtained, V represents a bus voltage, $P_n$ and $V_n$ represent a nominal power and voltage of the bus, and $K_z$, $K_i$, $K_p$ are the load modelling parameters, where $K_z$ represents constant impedance load coefficient, $K_i$ represents constant current load coefficient, and $K_p$ represents constant power load coefficient. In one embodiment, one or more voltage adjustment events may be used to determine the values of $K_z$, $K_i$.

In embodiments, where the load model is generated based on the voltage dependency, the aforementioned equation is modified to determine the values of $K_z$, $K_i$, $K_p$, where the modified equation may be represented as:

$$\text{Min} \sum_i \left\| P_i - (K_z * P_n)\left(\frac{V_i}{V_n}\right)^2 - (K_i * P_n)\left(\frac{V_i}{V_n}\right) - (K_p * P_n) \right\|$$

where $P_n$ is the nominal power, $P_i$ is the measured power of the power generation system at time instant (i) and is known, $V_n$ represents a nominal voltage at a particular location and $V_i$ represents a bus voltage at time instant (i). In this embodiment, the values of $K_z$, $K_i$, $K_p$ form the second set of load modelling parameters 130 and are used to determine the voltage dependency of the power grid 10. As used herein, voltage dependency may be defined as an ability of the power grid 10 to feed one or more loads coupled to the power grid 10 without loss of a load-generation power balance.

In another embodiment, the load model is generated based on the voltage sensitivity factor, where the voltage sensitivity factor is a derivative of power with respect to voltage. The load modelling unit 100 computes a ratio between difference of power ($\partial P$) and a difference of voltage ($\partial V$), where $\partial P$ represents a difference between power measured at a particular bus before a voltage adjustment event and power measured at the particular bus after the voltage adjustment event and similarly, $\partial V$ represents a difference between a voltage measured at the particular bus before the voltage adjustment event and a voltage measured at the particular bus after the voltage adjustment event. In one embodiment, the ratio is computed at a minimal voltage. Furthermore, the ratio and the algebraic equation is further used by the load modelling unit 100 to determine the voltage sensitivity factor, which may be represented as $(2K_z+K_i)$. The voltage sensitivity factor is further used by the load modelling unit 100 to generate the load model. In this embodiment, the voltage sensitivity factor forms the second set of load modelling parameters 130 which is further used to generate the load model 150.

In one embodiment, the load modelling unit 100 includes a recursive least mean square filter 140 which is employed to determine the second set of load modelling parameters 130 based on the first set of load modelling parameters 120 and the one or more voltage adjustment events 90. The recursive least mean square filter 140 uses the ZIP model equation to determine the values of the second set of load modelling parameters 130. In order to determine the values of the second set of load modelling parameters 130, the recursive least mean square filter 140 uses the first set of load modelling parameters 120 received from the load model library 110 as the initial conditions for performing the least mean square computations. In one embodiment, in situations where the first set of load modelling parameters 120 are unavailable from the load model library 110, the recursive least mean square filter 140 may use one or more predefined values. Furthermore, the recursive least mean square filter 140 obtains a forgetting factor and a weighing factor to recursively determine $K_z$, $K_i$, $K_p$. The forgetting factor and the weighing factor may be assigned values based on one or more predetermined criteria. The recursive least mean square filter 140 uses the weighing factor, forgetting factor and the values of $K_z$, $K_i$, $K_p$ from the first set of load modelling parameters 120 obtained from the load model library 110 to generate the second set of load modelling parameters $K'_z$, $K'_i$, $K'_p$.

The load modelling unit 100 further generates a simulated power output based on the load model 150 and determines an error 160 between a measured power 155 and the simulated power output 165. Such error is further used to update the load model library 110 with the second set of load modelling parameters 130 via a feedback loop 170 between the load modelling unit 100 and the load model library 110. The load model library 110 includes a plurality of clusters 180. The plurality of clusters 180 are chosen based on one or more predetermined criteria. The criteria are determined prior to structuring the load model library 110 such that the load model library 110 may assist in optimizing the operations of the load modelling unit 100. However, the plurality of clusters 180 may be chosen and updated in the load model library during the life of the system 20. In one embodiment, each of the plurality of clusters 180 may include one or more sub-clusters 190. In a specific embodiment, the plurality of clusters 180 and the one or more sub-clusters 190 represent a season, a day of the week, a time of the day, a temperature at the time of the day, or a combination thereof. During the course of operation of the system 20 for modelling loads in the power grid 10, the plurality of clusters 180, the one or more sub-clusters 190 or a combination thereof, may be updated with the second set of load modelling parameters 130 for each of the corresponding cluster 180 or sub-cluster 190. For example, if a first cluster represents a season, a first sub-cluster in the first cluster represents a week and the first sub-cluster includes another cluster representing day, the updated second set of load modelling parameters (not shown) in the load modelling library 110 will represent the load modelling parameters for a particular day of a week in a particular season. Such updating of the load model library 110 helps the load modelling unit 100 to determine the second set of load modelling parameters 130 without occurrence of the one or more voltage adjustment events 90 and also provides historical data for various related purposes. Continuing the example, such values of the second set of load modelling parameters 130 may be used again by the load modelling unit 100 to determine the load model 150 when the conditions represented by the clusters and the sub-clusters match with conditions of operating the power grid. In situations, where the voltage adjustment event is unavailable, the load modelling unit may use the values of the second set of load modelling parameters in the load model library 110 to determine the load model 150. In other situations, where the one or more voltage adjustment event is identified, the load modelling unit uses the second set of load modelling parameters in the load model library as the first set of load modelling parameters 120 to compute a new set of load modelling parameters 130 which is then updated in the load model library 110. Such process is repeated continuously during the operation of the system 20. Furthermore, the load model library 110 enables storing of only the values representative of the second set of load modelling parameters 130, thus reducing storage space and size. In one embodiment, the load model library 110 may be situated/stored in the system for modelling loads or may be communicatively coupled to the load modelling unit 100 from a remote location.

Figure 2:
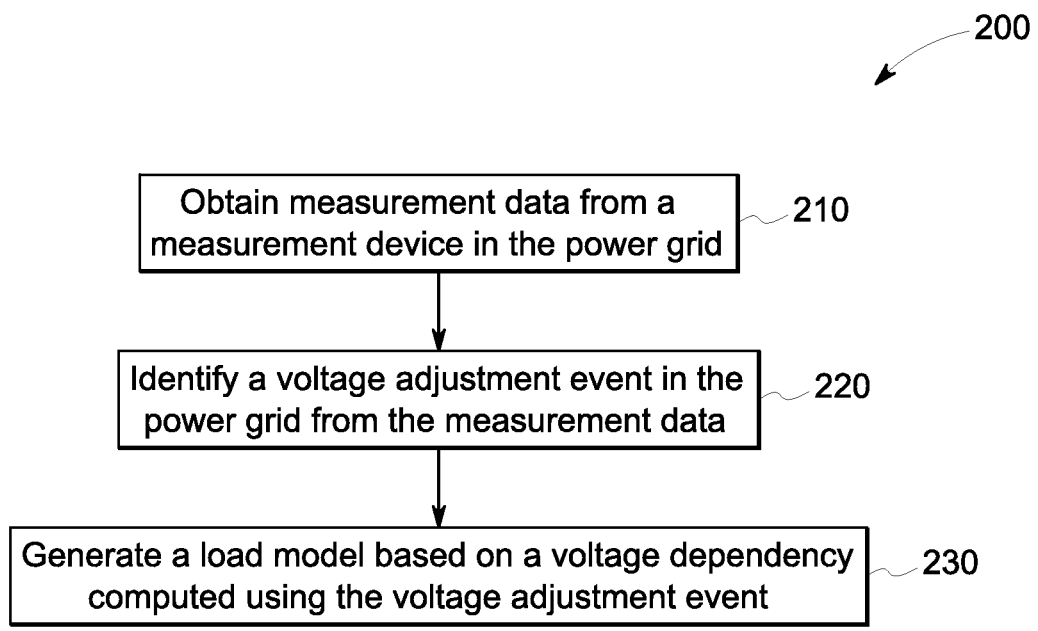
FIG. 2 is a flow chart representing steps involved in a method for modelling load in a power grid in accordance with embodiment of the invention.

FIG. 2 is a flow chart representing steps involved in a method 200 for modelling load in a power grid in accordance with embodiment of the invention. The method 200 includes obtaining measurement data from a measurement device in the power grid in step 210. In one embodiment, power, voltage and current from one or more locations in the power grid is obtained from the measurement device. In another embodiment, the power, the voltage, and the current from one or more locations is obtained by aggregating loads in the power grid. In a specific embodiment, the loads in the power grid are aggregated based on a predefined criteria to obtain the power, the voltage, and the current from one or more different locations in the power grid. The method 200 also includes identifying one or more voltage adjustment events in the power grid from the measurement data in step 220. In one embodiment, the measured data is filtered based on a predefined voltage threshold to identify the one or more voltage adjustment events. In one embodiment, a first set of load modelling parameters are obtained from a load model library. In another embodiment, a second set of load modelling parameters are determined based on the first set of load modelling parameters and the one or more voltage adjustment events. In a specific embodiment, the second set of load modelling parameters is determined using a recursive least mean square filter. In another embodiment, the load modelling library is updated with the second set of load modelling parameters. The method 200 further includes generating a load model based on a voltage dependency computed using the one or more voltage adjustment events in step 230. In one embodiment, the voltage dependency is determined using the second set of load modelling parameters. In a specific embodiment, generating the load model includes generating a static load model.

A person skilled in the art will understand that the aforementioned system 20 and the method 200 may be applied for generating an active power load model in the power grid and also a reactive power or an apparent power load model in the power grid 10 with necessary modifications. The voltage dependency factors and the modelling parameters thus computed using each of the real, reactive and apparent powers are expressed as independent sets of load modelling parameters and may be updated in the load model library along with the active power load modelling parameters as discussed herein.

As described herein, embodiments of the present invention enable the use of different load modelling parameters for different conditions using the measurement data collected during those or similar conditions. This allows accurate estimation of the nature of the load like voltage dependency and the voltage sensitivity factor. Such accurate estimation of the voltage dependency and voltage sensitivity factor provides a more reliable load model which helps in increasing efficiency and robustness of the power grid. Moreover, for some analytical purposes such as voltage stability analysis and/or contingency analysis, the voltage sensitivity factor may be used as an alternative to individual values of $K_z$, $K_i$, $K_p$ for accurate and faster analysis.

It is to be understood that a skilled artisan will recognize the interchangeability of various features from different embodiments and that the various features described, as well as other known equivalents for each feature, may be mixed and matched by one of ordinary skill in this art to construct additional systems and techniques in accordance with principles of this disclosure. It is, therefore, to be understood that the appended claims are intended to cover all such modifications and changes as fall within the true spirit of the invention.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for modelling load in a power grid comprising:
    obtaining measurement data from a measurement device in the power grid;
    identifying one or more voltage adjustment events in the power grid from the measurement data, wherein a voltage adjustment event comprises any change in voltage at a particular location in the power grid between a particular time instant and a previous time instant;
    generating a load model based on one or more voltage factors computed using the one or more voltage adjustment event;
    wherein one or more voltage factors include a voltage sensitivity factor, where the voltage sensitivity factor is a derivative of power with respect to voltage; and
    wherein generating the load model comprises utilizing a recursive least mean square filter to recursively determine a constant impedance load coefficient ($K_z$), a constant current load coefficient ($K_i$), and a constant power load coefficient ($K_p$) of a ZIP load model based on a forgetting factor and a weighing factor.

2. The method of claim 1, wherein obtaining the measurement data comprises obtaining power, voltage, and current from one or more locations in power grid.

3. The method of claim 2, wherein obtaining the power, the voltage and the current from one or more locations in the power grid comprises obtaining the power, the voltage and the current from aggregated loads in the power grid.

4. The method of claim 3, further comprising aggregating individual loads in the power grid based on a predefined criteria for obtaining the power, the voltage and the current in the power grid.

5. The method of claim 1, further comprising determining a second set of load modelling parameters based on a first set of load modelling parameters and the one or more voltage adjustments.

6. The method of claim 5, further comprising updating a load model library with the second set of load modelling parameters.

7. The method of claim 1, wherein generating the load model based on one or more voltage factors generating the load model based on a voltage dependency.

8. The method of claim 7, further comprising determining the voltage dependency using a second set of load modelling parameters.

9. The method of claim 1, wherein generating the load model comprises generating a static load model.

10. A system for generating a load model for a power grid comprising:
    a measurement device for obtaining measurement data in the power grid;
    an event filter configured to identify one or more voltage adjustment events in the power grid from the measurement data, wherein a voltage adjustment event comprises any change in voltage at a particular location in the power grid between a particular time instant and a previous time instant;
    a load modelling unit configured to generate a load model based on one or more voltage factors computed using the one or more voltage adjustment events;

wherein one or more voltage fact include a voltage sensitivity factor, where the voltage sensitivity factor is a derivative of power with respect to voltage; and wherein generating the load model comprises utilizing a recursive least mean square filter to recursively determine a constant impedance load coefficient ($K_z$), a constant current load coefficient ($K_i$), and a constant power load coefficient ($K_p$) of a ZIP load model based on a forgetting factor and a weighing factor.

11. The system of claim 10, wherein the measurement device comprises a supervisory control and data acquisition (SCADA) unit, a remote terminal unit (RTU), a phasor measurement unit (PMU), an advanced metering infrastructure (AMI) meter, a power factor meter, a power quality meter, or a combination thereof.

12. The system of claim 10, wherein the measurement data comprises power, a voltage and a current of one or more locations in the power grid.

13. The system of claim 10, wherein the load modelling unit and the event filter are deployed independently in the power grid, or deployed on a transmission system, a distribution system or a combination thereof in the power grid.

14. The system of claim 10, further comprising a load model library for storing load modelling parameters for each of a plurality of corresponding clusters.

15. The system of claim 14 wherein each of the plurality of cluster comprises at least one of a season, a day of the week, a time of the day, a temperature at the time of the day, or a combination thereof.

16. The system of claim 10, further comprising a recursive least mean square filter configured to determine a second set of load modelling parameters based on the first set of load modelling parameters and the one or more voltage adjustment events.

17. The system of claim 10, further comprising a feedback loop configured to update a load model library with a second set of load modelling parameters.

18. A non-transitory computer readable medium, having instructions stored thereon which, when executed, causes a load modelling system having a measurement device, an event filter and a load modelling unit to perform a method, the method comprising:

obtaining measurement data from the measurement device in the power grid;

identifying one or more voltage adjustment events in the power grid from the measurement data, wherein a voltage adjustment event comprises any change in voltage at a particular location in the power grid between a particular time instant and a previous time instant;

obtaining a first set of load modelling parameters from a load model library;

determining a second set of load modelling parameters based on the first set of load modelling parameters and the one or more voltage adjustment events using a recursive least mean square filter;

determining one or more voltage factors for the power grid using the second set of load modelling parameters;

generating a load model based on one or more voltage factors for the power grid;

updating the load model library with the second set of load modelling parameters;

wherein one or more voltage factors include a voltage sensitivity factor, where the voltage sensitivity factor is a derivative of power with respect to voltage; and wherein generating the load model comprises utilizing a recursive least mean square filter to recursively determine a constant impedance load coefficient ($K_z$), a constant current load coefficient ($K_i$), and a constant power load coefficient ($K_p$) of a ZIP load model based on a forgetting factor and a weighing factor.

19. The method of claim 1, wherein identifying one or more voltage adjustment events includes satisfying conditions (i) $(\partial V) > V_{th}$, and (ii) $(\partial P * \partial V > 0)$, where $V_{th}$ is a predefined voltage threshold, and $(\partial V)$ and $(\partial P)$ are differences between a voltage and active power measured at the particular location at the first time instant and the previous time instant respectively.

20. The method of claim 1, wherein identifying one or more voltage adjustment events includes satisfying conditions (i) $(\partial V) > V_{th}$, (ii) $(\partial P * \partial V > 0)$, and (iii) $(\partial Q * \partial V > 0)$, where $V_{th}$ is a predefined voltage threshold, and $(\partial V)$, $(\partial P)$ and, $(\partial Q)$ are differences between a voltage, active power and reactive power measured at the particular location at the first time instant and the previous time instant respectively.

* * * * *